United States Patent
Wang

(10) Patent No.: US 6,500,728 B1
(45) Date of Patent: Dec. 31, 2002

(54) SHALLOW TRENCH ISOLATION (STI) MODULE TO IMPROVE CONTACT ETCH PROCESS WINDOW

(75) Inventor: Ling-Sung Wang, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/154,741

(22) Filed: May 24, 2002

(51) Int. Cl.[7] ............................................... H01L 21/76
(52) U.S. Cl. ...................................................... 438/424
(58) Field of Search .......................................... 438/424

(56) References Cited

U.S. PATENT DOCUMENTS

| | | | |
|---|---|---|---|
| 5,731,242 A | * | 3/1998 | Parat et al. |
| 5,930,645 A | | 7/1999 | Lyons et al. ................. 438/424 |
| 6,100,160 A | | 8/2000 | Hames ........................ 438/424 |
| 6,265,302 B1 | * | 7/2001 | Lim et al. |
| 6,297,126 B1 | * | 10/2001 | Lim et al. |
| 6,297,128 B1 | | 10/2001 | Kim et al. ................... 438/437 |
| 6,306,725 B1 | | 10/2001 | Nag et al. .................... 438/435 |
| 6,335,249 B1 | * | 1/2002 | Thei et al. |
| 6,342,428 B1 | * | 1/2002 | Zheng et al. |
| 6,350,661 B2 | * | 2/2002 | Lim et al. |
| 6,448,149 B1 | * | 9/2002 | Lee et al. |
| 2001/0031540 A1 | * | 10/2001 | Lim et al. |
| 2002/0004285 A1 | * | 1/2002 | Wu |

* cited by examiner

*Primary Examiner*—John F. Niebling
*Assistant Examiner*—Stanetta Isaac
(74) *Attorney, Agent, or Firm*—George O. Saile; Stephen B. Ackerman; Stephen G. Stanton

(57) ABSTRACT

A method of fabricating a dual-oxide STI comprising the following steps. A structure having an STI opening formed therein is provided. An HDP silicon oxide layer portion is formed within the STI opening, partially filling the STI opening. A planarized HDP silicon-rich-oxide cap layer is formed upon the HDP silicon oxide layer portion, filling the STI opening to form the dual-oxide STI, whereby any unlanded contact window formed through an overlying interlevel dielectric layer exposing a portion of the dual-oxide STI only exposes a portion of the HDP silicon-rich-oxide cap layer.

52 Claims, 3 Drawing Sheets

SHALLOW TRENCH ISOLATION (STI) MODULE TO IMPROVE CONTACT ETCH PROCESS WINDOW

FIELD OF THE INVENTION

The present invention relates generally to semiconductor fabrication and more specifically to fabrication of shallow trench isolation (STI) structures.

BACKGROUND OF THE INVENTION

After formation of conventional shallow trench isolation structures (STIs), if the subsequent contact photolithography process is misaligned to the OD (active region) layer, the contact etch may attack the STI profile and induce leakage issues.

U.S. Pat. No. 6,297,128 B1 to Kim et al. describes an STI trench filled with multiple layers including high density plasma (HDP) oxide.

U.S. Pat. No. 6,100,160 to Hames describes an STI process using HDP oxide and a nitration step.

U.S. Pat. No. 5,930,645 to Lyons et al. describes an STI process using HDP oxide.

U.S. Pat. No. 6,306,725 to Nag et al. describes an STI trench filled with two layers including HDP oxide.

SUMMARY OF THE INVENTION

Accordingly, it is an object of one or more embodiments of the present invention to provide an STI structure that minimizes the deleterious effects of unlanded contact windows.

Other objects will appear hereinafter.

It has now been discovered that the above and other objects of the present invention may be accomplished in the following manner. Specifically, a structure having an STI opening formed therein is provided. An HDP silicon oxide layer portion is formed within the STI opening, partially filling the STI opening. A planarized HDP silicon-rich-oxide cap layer is formed upon the HDP silicon oxide layer portion, filling the STI opening to form the dual-oxide STI, whereby any unlanded contact window formed through an overlying interlevel dielectric layer exposing a portion of the dual-oxide STI only exposes a portion of the HDP silicon-rich-oxide cap layer.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Initial Structure

Figure 1:
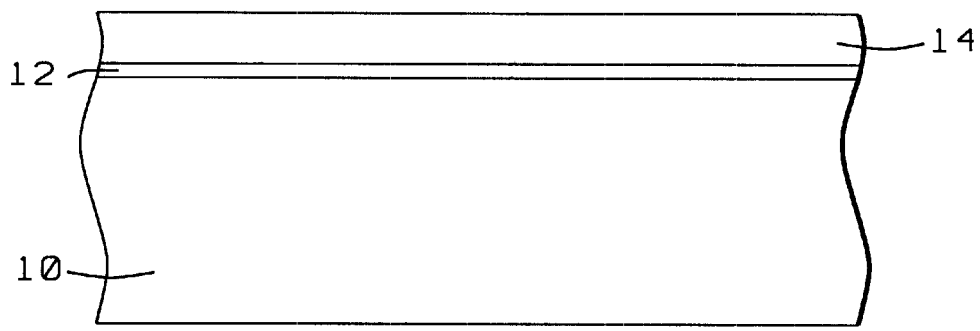
FIGS. 1 to 8 schematically illustrates a preferred embodiment of the present invention.

As shown in FIG. 1, structure 10 has an overlying pad oxide layer 12 formed thereover formed to a thickness of preferably from about 100 to 150 Å.

Structure 10 is preferably understood to possibly include a semiconductor wafer or substrate, and is preferably either a silicon wafer or a silicon substrate.

A hard mask layer 14 is formed over pad oxide layer 12 to a thickness of preferably from about 1000 to 1500 Å. Hard mask layer 14 is preferably formed of silicon nitride (SiN) or silicon oxynitride (SiON) and is more preferably SiN as will be used for illustrative purposes hereafter.

Shallow Trench Isolation Opening Etch

Figure 2:
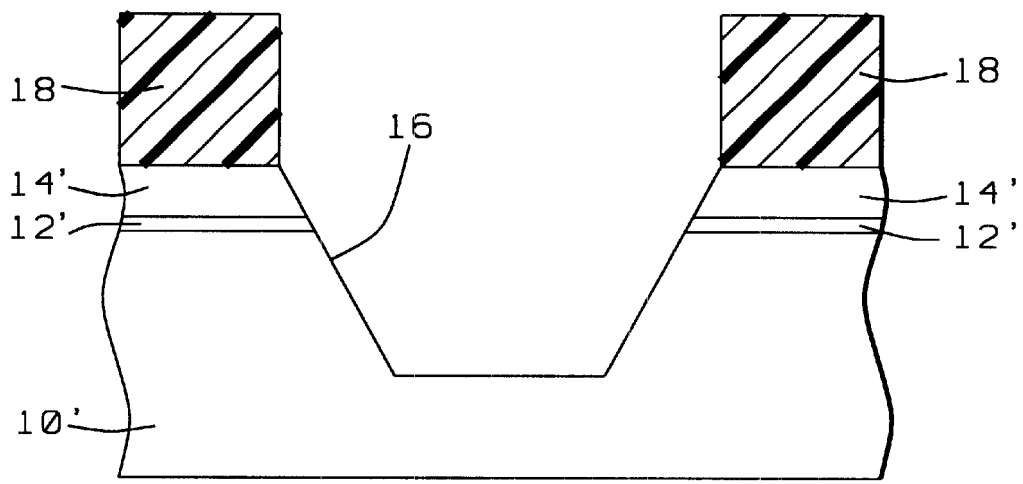

As shown in FIG. 2, SiN hard mask layer 14, pad oxide layer 12 and silicon substrate 10 are etched to form shallow trench isolation (STI) opening 16 within silicon substrate 10.

SiN layer 14, pad oxide layer 12 and silicon substrate 10 may be etched using an overlying patterned mask layer 18 that is preferably comprised of photoresist as shown in FIG. 2.

Formation of Dual Layer Oxide Layers 20, 22

Figure 3:
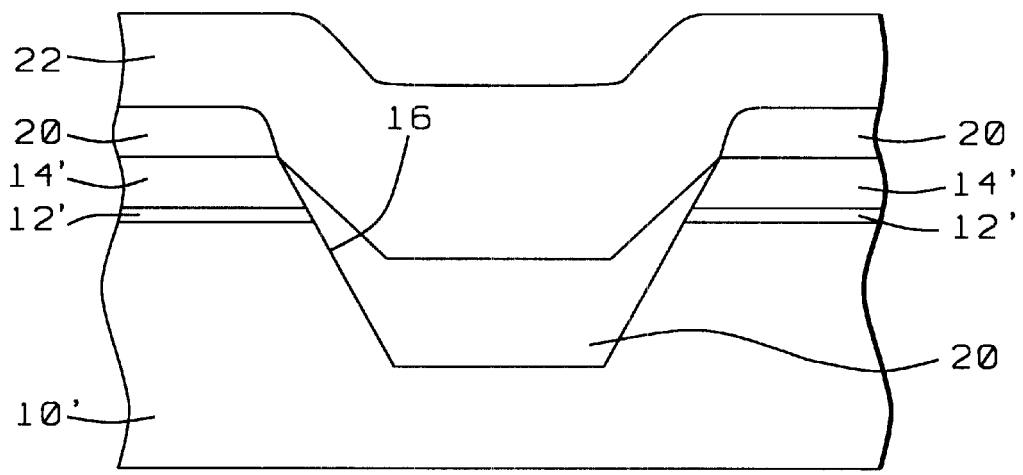

As shown in FIG. 3, a high density plasma (HDP) silicon oxide layer 20 is formed within STI opening 16, partially filling STI opening 16, and over etched SiN layer 14' to a thickness of preferably from about 3300 to 3700 Å and more preferably from about 3400 to 3600 Å and most preferably about 3500 Å.

Then, an HDP silicon-rich-oxide (SRO) layer 22 is formed over the HDP-oxide layer 20 to a thickness of preferably from about 2800 to 3200 Å and more preferably from about 2900 to 3100 Å and most preferably about 3000 Å. HDP-SRO layer 22 has a refractive index (RI) greater than about 1.5.

HDP-SRO layer 22 has a silicon concentration of preferably from about 33.3 to 40.0%, more preferably from about 33.4 to 36.0% and most preferably about 35.0%.

Planarization of HDP-Oxide Layer 20 and HDP-SRO Layer 22 to Form Dual-Oxide STI 25

Figure 4:
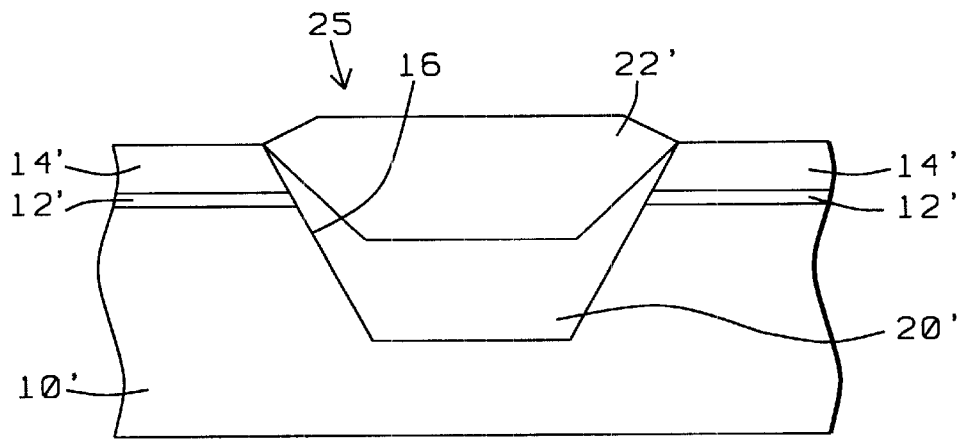

As shown in FIG. 4, HDP-SRO layer 22 and HDP-oxide layer 20 are planarized to remove the excess of HDP-SRO layer 22 and HDP-oxide layer 20 from over SiN layer 14 to form a dual-oxide STI 25. Dual-oxide STI 25 includes an underlying HDP-oxide layer portion 20' with an overlying HDP-SRO cap layer 22'. The underlying HDP-oxide layer portion 20' has a thickness of preferably from about 3300 to 3700 Å and more preferably from about 3400 to 3600 Å and most preferably about 3500 Å. The overlying HDP-SRO cap layer 22' has a thickness of preferably from about 2800 to 3200 Å, more preferably from about 2900 to 3100 Å and most preferably about 3000 Å.

Removal of Etched SiN Layer 14' and Etched Pad Oxide Layer 12'

Figure 5:
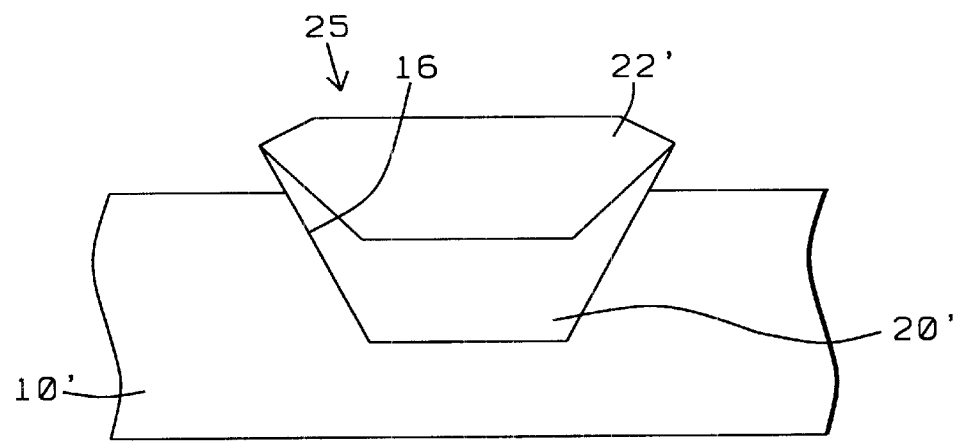

As shown in FIG. 5, etched SiN layer 14' is removed preferably using an $H_3PO_4$ chemical wet etch process. The structure may be cleaned as necessary. Etched pad oxide layer 12' is then removed from over silicon substrate 10 preferably using an HF chemical wet etch.

Growth of Gate Oxide Layer 24

Well implants (not shown) may then be performed.

Figure 6:
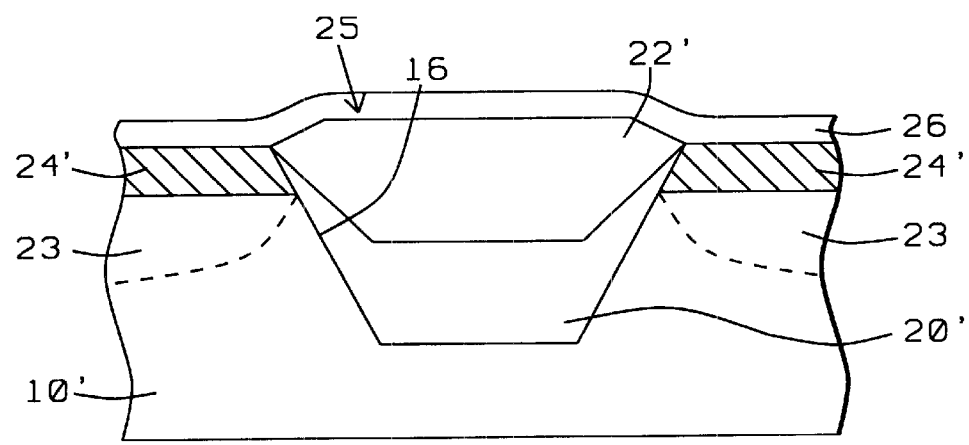

As shown in FIG. 6, a gate oxide layer 24 is then grown over silicon substrate 10 to a thickness of preferably from about 25 to 35 Å and more preferably from about 28 to 32 Å.

LDD implants (not shown) may then be performed, spacers (not shown) may be formed and source/drain (S/D) implants 23 may then be performed. After the S/D implants 23 are formed, the gate oxide layer 24 may be converted to co-silicide layer 24'.

A contact etch-stop layer 26 is then formed over gate oxide/co-silicide layer 24 and over HDP-SRO cap layer 22' of dual-oxide STI 25 to a thickness of preferably from about 200 to 400 Å and more preferably from about 250 to 350 Å. Contact etch-stop layer 26 is preferably formed of silicon oxynitride (SiON).

Formation of Planarized Interlayer Dielectric (ILD) Layer 28

Figure 7:
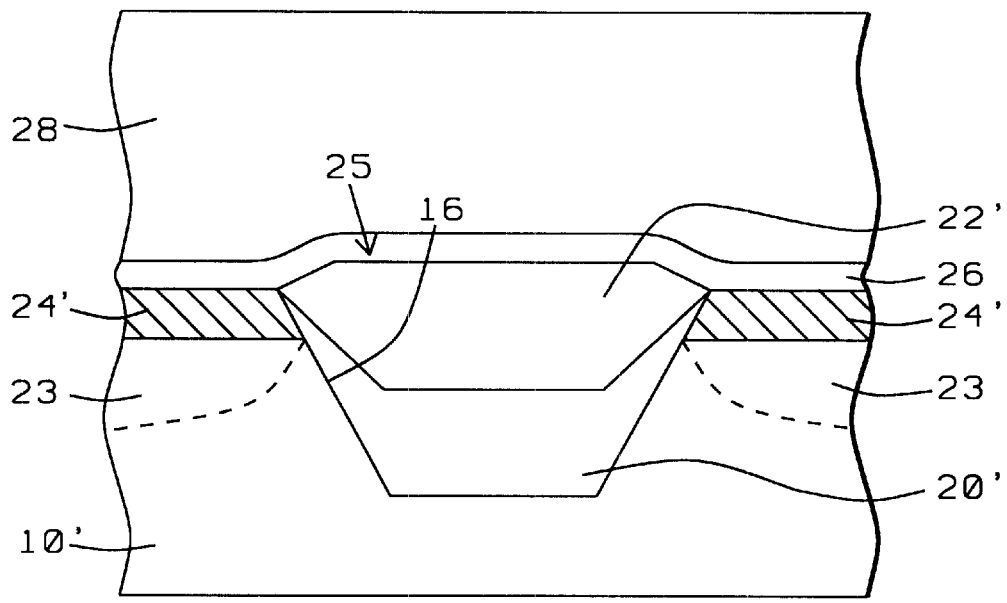

As shown in FIG. 7, a planarized interlayer dielectric (ILD) layer 28 is formed over contact etch-stop layer 26 to a thickness of preferably from about 200 to 400 Å and more preferably from about 250 to 350 Å.

Formation of Contact Window 30

Figure 8:
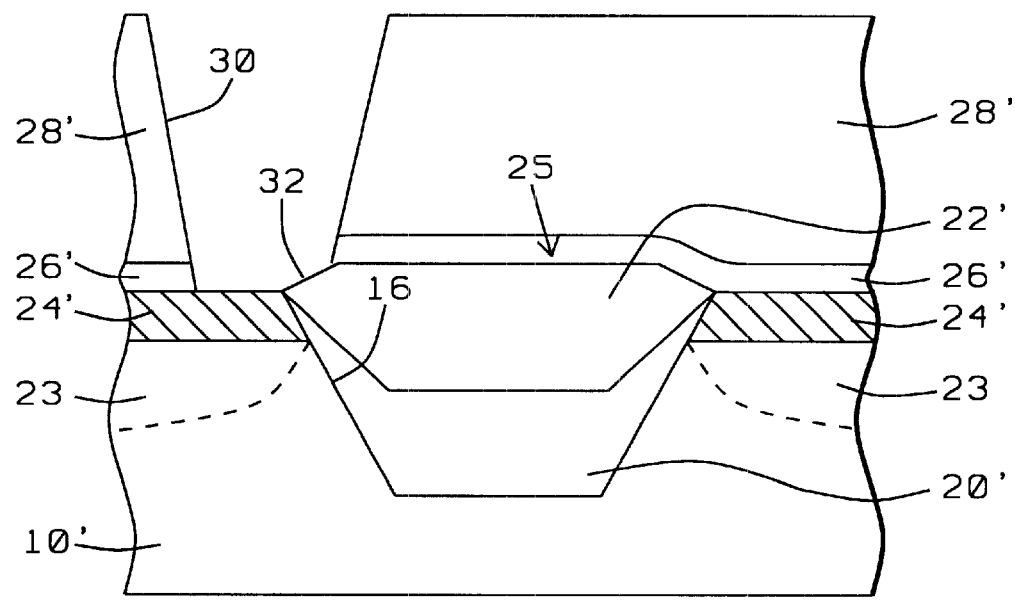

As shown in FIG. 8, ILD layer 28 is etched to form a contact window 30 which, as shown in FIG. 8, may be unlanded, i.e. exposing a portion 32 of dual-oxide STI 25. It is noted that any such unlanded contact window 30 exposes only a portion 32 of HDP-SRO cap layer 22'.

In accordance with the present invention, the formation of HDP-SRO cap layer 22' over HDP-oxide layer 20' to form dual oxide STI 25 causes the ILD layer 28 etch to contact HDP-SRO cap layer 22' so that the ILD layer etch selectivity ensures that any unlanded contact windows 30 do not cause large junction leakage issues that would otherwise occur.

$$\text{O.E. selectivity} = \frac{\text{etch rate SiON}}{\text{etch rate silicide}} \frac{1000}{10}$$

$$\text{O.E. selectivity} = \frac{\text{etch rate SiON}}{\text{etch rate HDP-SRO oxide}} \frac{100}{10}$$

Where "O.E." is an abbreviation for over etch.

Advantages of the Present Invention

The advantages of one or more embodiments of the present invention include improved contact etch process window.

While particular embodiments of the present invention have been illustrated and described, it is not intended to limit the invention, except as defined by the following claims.

I claim:

1. A method of fabricating a dual-oxide STI, comprising the steps of:
   providing a structure having an STI opening formed therein;
   forming an HDP silicon oxide layer portion within the STI opening, partially filling the STI opening; and
   forming a planarized HDP silicon-rich-oxide cap layer upon the HDP silicon oxide layer portion, filling the STI opening to form the dual-oxide STI; whereby any unlanded contact window formed through an overlying interlevel dielectric layer exposing a portion of the dual-oxide STI only exposes a portion of the HDP silicon-rich-oxide cap layer.

2. The method of claim 1, wherein the structure is a silicon substrate.

3. The method of claim 1, wherein the HDP silicon oxide layer portion of the dual-oxide STI has a thickness of from about 3300 to 3700 Å and the HDP silicon-rich-oxide cap layer of the dual-oxide STI has a thickness of from about 2800 to 3200 Å.

4. The method of claim 1, wherein the HDP silicon oxide layer portion of the dual-oxide STI has a thickness of from about 3400 to 3600 Å and the HDP silicon-rich-oxide cap layer of the dual-oxide STI has a thickness of from about 2900 to 3100 Å.

5. The method of claim 1, wherein the HDP silicon oxide layer portion of the dual-oxide STI has a thickness of about 3500 Å and the HDP silicon-rich-oxide cap layer of the dual-oxide STI has a thickness of about 3000 Å.

6. The method of claim 1, further including the step of forming a gate oxide layer over the structure adjacent the dual-oxide STI.

7. The method of claim 1, further including the step of forming a gate oxide layer over the structure adjacent the dual-oxide STI to a thickness of from about 25 to 35 Å.

8. The method of claim 1, further including the step of forming a gate oxide layer over the structure adjacent the dual-oxide STI to a thickness of from about 28 to 32 Å.

9. The method of claim 1, further including the steps of:
   forming a gate oxide layer upon the structure; and
   forming a contact etch-stop layer over the gate oxide layer.

10. The method of claim 1, further including the step of forming a gate oxide layer upon the structure.

11. The method of claim 1, further including the steps of:
    forming a gate oxide layer upon the structure; and
    forming an SiON contact etch-stop layer over the gate oxide layer.

12. The method of claim 1, further including the steps of:
    forming a gate oxide layer upon the structure; and
    forming a contact etch-stop layer over the gate oxide layer to a thickness of from about 200 to 400 Å.

13. The method of claim 1, further including the steps of:
    forming a gate oxide layer upon the structure; and
    forming a contact etch-stop layer over the gate oxide layer to a thickness of from about 250 to 350 Å.

14. The method of claim 1, wherein the HDP silicon-rich-oxide cap layer has a silicon concentration of from about 33.3 to 40.0%.

15. The method of claim 1, wherein the HDP silicon-rich-oxide cap layer has a silicon concentration of from about 33.4 to 36.0%.

16. The method of claim 1, wherein the HDP silicon-rich-oxide cap layer has a silicon concentration of about 35.0%.

17. The method of claim 1, wherein the HDP silicon-rich-oxide cap layer has a refractive index greater than about 1.5.

18. The method of claim 1, further including the step of forming a co-silicide layer over the structure adjacent the dual-oxide STI.

19. A method of fabricating a dual-oxide STI, comprising the steps of:
    providing a structure having an overlying pad oxide layer formed thereover;
    forming a hard mask layer over the pad oxide layer 12;
    etching the hard mask layer, pad oxide layer and the structure to form an STI opening within the structure;
    forming an HDP silicon oxide layer over the etched hard mask layer and within the STI opening, partially filling the STI opening;
    forming an HDP silicon-rich-oxide layer upon the HDP silicon oxide layer, filling the STI opening;
    planarizing the HDP silicon-rich-oxide layer and the HDP silicon oxide layer to remove the excess of the HDP silicon-rich-oxide layer and the HDP silicon oxide layer from over the etched hard mask layer to form a lower HDP silicon oxide layer portion and an overlying planarized HDP silicon-rich-oxide cap layer within the STI opening; the lower HDP silicon oxide layer portion and the overlying planarized HDP silicon-rich-oxide cap layer comprising the dual-oxide STI; and
    forming an interlevel dielectric layer over the dual-oxide STI and the structure; whereby any unlanded contact window formed through the interlevel dielectric layer exposing a portion of the STI exposes only a portion of the HDP silicon-rich-oxide cap layer.

20. The method of claim 19, wherein the structure is a silicon substrate.

21. The method of claim 19, wherein the HDP silicon oxide layer portion of the dual-oxide STI has a thickness of from about 3300 to 3700 Å and the HDP silicon-rich-oxide cap layer of the dual-oxide STI has a thickness of from about 2800 to 3200 Å.

22. The method of claim 19, wherein the HDP silicon oxide layer portion of the dual-oxide STI has a thickness of from about 3400 to 3600 Å and the HDP silicon-rich-oxide cap layer of the dual-oxide STI has a thickness of from about 2900 to 3100 Å.

23. The method of claim 19, wherein the HDP silicon oxide layer portion of the dual-oxide STI has a thickness of about 3500 Å and the HDP silicon-rich-oxide cap layer of the dual-oxide STI has a thickness of about 3000 Å.

24. The method of claim 19, wherein the pad oxide layer has a thickness of from about 100 to 150 Å and the hard mask layer has a thickness of from about 1000 to 1500 Å.

25. The method of claim 19, further including the steps of:
removing the hard mask layer and the pad oxide layer from over the structure after fabrication of the dual-oxide STI;
then forming a co-silicide layer over the structure adjacent the dual-oxide STI; and
then forming a contact etch-stop layer over the co-silicide layer and the dual-oxide STI before formation of the interlevel dielectric layer.

26. The method of claim 19, wherein the hard mask layer is comprised of SiN or SiON.

27. The method of claim 19, wherein the hard mask layer is comprised of SiON.

28. The method of claim 19, further including the steps of:
removing the hard mask layer and the pad oxide layer from over the structure after fabrication of the dual-oxide STI;
then forming a gate oxide layer over the structure adjacent the dual-oxide STI; and
then forming a contact etch-stop layer over the gate oxide layer and the dual-oxide STI before formation of the interlevel dielectric layer.

29. The method of claim 19, further including the steps of:
removing the hard mask layer and the pad oxide layer from over the structure after fabrication of the dual-oxide STI;
then forming a gate oxide layer over the structure adjacent the dual-oxide STI to a thickness of from about 25 to 35 Å; and
then forming a contact etch-stop layer over the gate oxide layer and the dual-oxide STI before formation of the interlevel dielectric layer; the contact etch-stop layer having a thickness of from about 200 to 400 Å.

30. The method of claim 19, further including the steps of:
removing the hard mask layer and the pad oxide layer from over the structure after fabrication of the dual-oxide STI;
then forming a gate oxide layer over the structure adjacent the dual-oxide STI to a thickness of from about 28 to 32 Å; and
then forming a contact etch-stop layer over the gate oxide layer and the dual-oxide STI before formation of the interlevel dielectric layer; the contact etch-stop layer having a thickness of from about 250 to 350 Å.

31. The method of claim 19, further including the steps of:
removing the hard mask layer and the pad oxide layer from over the structure after fabrication of the dual-oxide STI;
then forming a gate oxide layer over the structure adjacent the dual-oxide STI; and
then forming an SiON contact etch-stop layer over the gate oxide layer and the dual-oxide STI before formation of the interlevel dielectric layer.

32. The method of claim 19, wherein the HDP silicon-rich-oxide layer has a silicon concentration of from about 33.3 to 40.0%.

33. The method of claim 19, wherein the HDP silicon-rich-oxide layer has a silicon concentration of from about 33.4 to 36.0%.

34. The method of claim 19, wherein the HDP silicon-rich-oxide layer has a silicon concentration of about 35.0%.

35. The method of claim 19, wherein the HDP silicon-rich-oxide cap layer has a refractive index greater than about 1.5.

36. A method of fabricating a dual-oxide STI, comprising the steps of:
providing a silicon substrate having an STI opening formed therein;
forming an HDP silicon oxide layer portion within the STI opening, partially filling the STI opening; and
forming a planarized HDP silicon-rich-oxide cap layer upon the HDP silicon oxide layer portion, filling the STI opening to form the dual-oxide STI; whereby any unlanded contact window formed through an overlying interlevel dielectric layer exposing a portion of the dual-oxide STI only exposes a portion of the HDP silicon-rich-oxide cap layer.

37. The method of claim 36, wherein the HDP silicon oxide layer portion of the dual-oxide STI has a thickness of from about 3300 to 3700 Å and the HDP silicon-rich-oxide cap layer of the dual-oxide STI has a thickness of from about 2800 to 3200 Å.

38. The method of claim 36, wherein the HDP silicon oxide layer portion of the dual-oxide STI has a thickness of from about 3400 to 3600 Å and the HDP silicon-rich-oxide cap layer of the dual-oxide STI has a thickness of from about 2900 to 3100 Å.

39. The method of claim 36, wherein the HDP silicon oxide layer portion of the dual-oxide STI has a thickness of about 3500 Å and the HDP silicon-rich-oxide cap layer of the dual-oxide STI has a thickness of about 3000 Å.

40. The method of claim 36, further including the step of forming a gate oxide layer over the silicon substrate adjacent the dual-oxide STI.

41. The method of claim 36, further including the step of forming a gate oxide layer over the structure adjacent the dual-oxide STI to a thickness of from about 25 to 35 Å.

42. The method of claim 36, further including the step of forming a gate oxide layer over the silicon substrate adjacent the dual-oxide STI to a thickness of from about 28 to 32 Å.

43. The method of claim 36, further including the steps of:
forming a gate oxide layer upon the silicon substrate; and
forming a contact etch-stop layer over the gate oxide layer.

44. The method of claim 36, further including the step of forming a gate oxide layer upon the silicon substrate.

45. The method of claim 36, further including the steps of:
forming a gate oxide layer upon the silicon substrate; and
forming an SiON contact etch-stop layer over the gate oxide layer.

46. The method of claim 36, further including the steps of:
forming a gate oxide layer upon the silicon substrate; and
forming a contact etch-stop layer over the gate oxide layer to a thickness of from about 200 to 400 Å.

47. The method of claim 36, further including the steps of:
forming a gate oxide layer upon the silicon substrate; and
forming a contact etch-stop layer over the gate oxide layer to a thickness of from about 250 to 350 Å.

48. The method of claim 36, wherein the HDP silicon-rich-oxide cap layer has a silicon concentration of from about 33.3 to 40.0%.

49. The method of claim 36, wherein the HDP silicon-rich-oxide cap layer has a silicon concentration of from about 33. 4 to 36.0%.

50. The method of claim 36, wherein the HDP silicon-rich-oxide cap layer has a silicon concentration of about 35.0%.

51. The method of claim 36, wherein the HDP silicon-rich-oxide cap layer has a refractive index greater than about 1.5.

52. The method of claim 36, further including the step of forming a co-silicide layer over the silicon substrate adjacent the dual-oxide STI.

* * * * *